United States Patent
Chaney et al.

(10) Patent No.: US 10,221,476 B2
(45) Date of Patent: Mar. 5, 2019

(54) COATING INSULATING MATERIALS FOR IMPROVED LIFE

(71) Applicant: Varian Semiconductor Equipment Associates, Inc., Gloucester, MA (US)

(72) Inventors: Craig R. Chaney, Lanesville, MA (US); Neil J. Bassom, Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 881 days.

(21) Appl. No.: 13/908,320

(22) Filed: Jun. 3, 2013

(65) Prior Publication Data

US 2014/0352617 A1     Dec. 4, 2014

(51) Int. Cl.
| | |
|---|---|
| *H01L 21/67* | (2006.01) |
| *H01J 37/32* | (2006.01) |
| *C23C 14/48* | (2006.01) |
| *C23C 14/56* | (2006.01) |
| *H01J 37/317* | (2006.01) |

(52) U.S. Cl.
CPC .......... *C23C 14/48* (2013.01); *C23C 14/564* (2013.01); *H01J 37/3171* (2013.01); *H01J 2237/022* (2013.01); *H01J 2237/038* (2013.01)

(58) Field of Classification Search
CPC .............................. C23C 14/48; H01J 37/3171
See application file for complete search history.

(56) References Cited

U.S. PATENT DOCUMENTS

| | | | | | |
|---|---|---|---|---|---|
| 4,935,303 | A | * | 6/1990 | Ikoma | C23C 16/26 428/408 |
| 5,920,076 | A | * | 7/1999 | Burgin | H01J 27/022 250/423 R |
| 5,952,060 | A | * | 9/1999 | Ravi | C23C 16/26 118/722 |
| 6,903,349 | B2 | * | 6/2005 | Mitchell | H01J 37/3171 250/396 R |
| 2003/0230986 | A1 | * | 12/2003 | Horsky | C23C 14/48 315/111.81 |
| 2007/0210260 | A1 | * | 9/2007 | Horsky | C23C 14/48 250/424 |
| 2008/0054194 | A1 | * | 3/2008 | Kim | H01J 37/32082 250/492.21 |
| 2008/0237496 | A1 | * | 10/2008 | Gupta | H01J 37/08 250/492.21 |
| 2010/0108915 | A1 | * | 5/2010 | Becker | H01J 37/08 250/492.3 |
| 2010/0154835 | A1 | * | 6/2010 | Dimeo | C23C 14/564 134/31 |

* cited by examiner

Primary Examiner — Charlee J C Bennett
(74) Attorney, Agent, or Firm — Nields, Lemack & Frame, LLC

(57) ABSTRACT

A system for extending the life of insulating components disposed within a housing, such as an ion implanter, is disclosed. The system includes one or more insulating components, disposed in the housing, which are coated with a diamond like carbon (DLC) coating. The insulating components may be bushings or any insulating component used to electrically isolate two components having different voltage potentials, such as electrodes. This DLC coating retards the deposition of metals, such as those contained in the ion source, on the insulating components. This reduces the likelihood or electrical arcing or other phenomenon that affect the useful life of these insulating component.

14 Claims, 1 Drawing Sheet

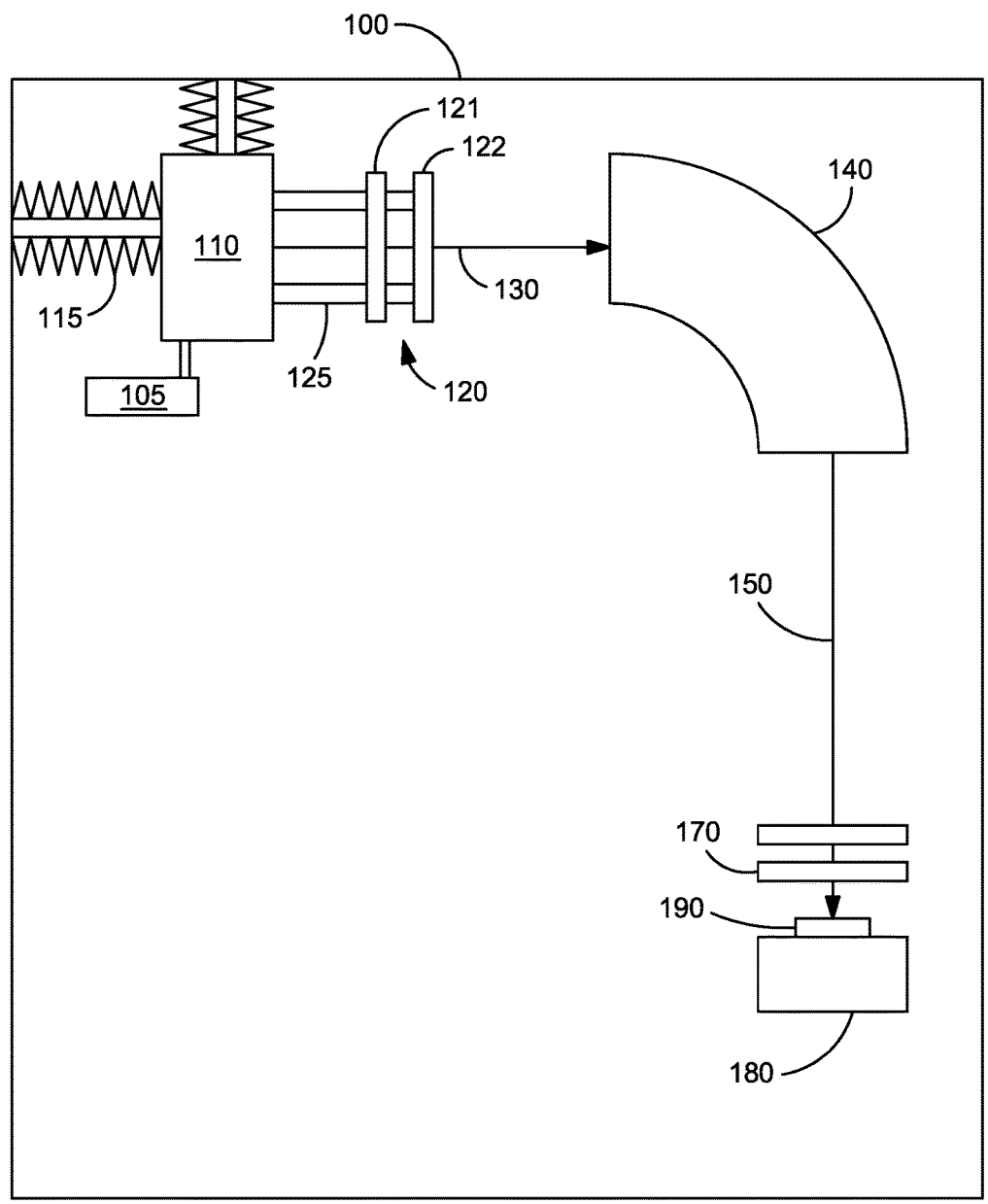

COATING INSULATING MATERIALS FOR IMPROVED LIFE

Embodiments of the present invention relate to methods and apparatus for extending the useful life of insulators, particularly insulators within housings, by reducing the amount of material that is deposited on them.

BACKGROUND

Semiconductor, solar, or other types of workpieces may be processed within ion implantation systems. Some ion implantation systems may comprise an ion source, extraction electrodes, a mass analyzer, a collimating magnet, one or more acceleration or deceleration stages and a process chamber that holds the workpiece. Throughout this disclosure, the term "housing" is used to refer to any chamber or other enclosure through which an ion beam passes. Thus, the housings include, for example, the deceleration stages, the mass analyzer, the collimating magnet and the process chamber. It is common for components disposed within these housings, such as the interior walls, electrodes, insulators and other equipment to show signs of deterioration or become coated. This may be due to the deposition of ions or other materials on these components. For example, metallic material, such as tungsten, may be etched from within the ion source, and become deposited on a bushing or other insulating component in another region of the ion implantation system. For example, components, such as bushings, cables, electrodes, lenses, and interior walls may become coated. These coatings may become deleterious. For example, a coating may be more conductive than the underlying component, thereby creating a conductive path where none previously existed.

Therefore, after a period of ion implantation system operation, this coating becomes deleterious, and must be removed. This is a common practice in this field and these coatings may be removed during a process known as a preventative maintenance (or "PM") cycle. During the preventative maintenance cycle, each component may be cleaned in order to remove the coating, or replaced if the damage is too significant. This process may be quite time consuming, as each component must be inspected and cleaned. This may result in unacceptable periods of time where the housings are inactive, which results in reduced throughput. In addition, the frequency of this preventative maintenance may be unacceptable. For example, in some embodiments, where $BF_3$ is used as a feed gas, preventative maintenance may need to be performed after only 75 hours of continuous operation.

In some embodiments, a co-gas, such as $Xe:H_2$ is also fed into the ion source. This co-gas disrupts the halogen cycle, greatly reducing the production of volatile tungsten compounds. However, the use of a co-gas may be expensive and reduces the concentration of feed gas. This approach also requires the use of one of the valuable bottle positions in the tool. Therefore, an improved system and method of extending the life of components, and particularly insulating components, disposed within a housing would be beneficial.

SUMMARY

A system for extending the life of insulating components disposed within a housing, such as an ion implanter, is disclosed. The system includes one or more insulating components, disposed in the housing, which are coated with a diamond like carbon (DLC) coating. The insulating components may be bushings or any insulating component used to electrically isolate two components having different voltage potentials, such as electrodes. This DLC coating retards the deposition of metals, such as those contained in the ion source, on the insulating components. This reduces the likelihood or electrical arcing or other phenomenon that affect the useful life of these insulating component.

According to one embodiment, an ion implanter is disclosed, which comprises a housing; an ion source, for generation of ions for implanting into a workpiece, in the housing; a source bushing to electrically isolate the ion source from the housing; an electrode to extract ions from the ion source; a first insulating component to hold the electrode in place; at least one second insulating component disposed in the housing; and a workpiece support on which the workpiece to be implanted is disposed, wherein at least one of the first insulating component, the second insulating component and the source bushing is coated with diamond like carbon (DLC).

According to a second embodiment, an ion implanter is disclosed, which comprises an ion source, for generation of ions for implanting into a workpiece, the ion source having a component being constructed of a metal; a feed gas source containing a feed gas comprising a halogen, supplied to the ion source, the feed gas etching the metal from the ion source; at least one insulating component, disposed to electrically isolate two components having different voltage potentials; wherein the insulating component is coated with a coating that resists the deposition of the etched metal on the insulating component.

According to another embodiment, an ion implanter is disclosed, which comprises a housing; an ion source in the housing, for generation of ions for implanting into a workpiece, the ion source having a component that comprises tungsten; a feed gas source configured to supply a feed gas comprising fluorine to the ion source, the feed gas etching the tungsten from the ion source and forming a tungsten fluoride gas; a source bushing to electrically isolate the ion source from the housing; an electrode to extract ions from the ion source; and a workpiece support on which the workpiece to be implanted is disposed, wherein the source bushing is coated with diamond like carbon (DLC) to inhibit deposition of the tungsten fluoride gas on the source bushing.

BRIEF DESCRIPTION OF THE FIGURES

For a better understanding of the present disclosure, reference is made to the accompanying drawings, which are incorporated herein by reference and in which:

FIG. 1 shows a representative ion implantation system according to one embodiment.

DETAILED DESCRIPTION

FIG. 1 shows a representative ion implantation system that may be used in accordance with one embodiment. In this system, there is an ion source 110, which is in communication with a feed gas source. Feed gas is supplied to the ion source 110 from a feed gas source 105. The feed gas may be any suitable gas. For example, in some embodiments, a boron-containing gas, such as $BF_3$ or diborane may be used. In other embodiments, a phosphorus containing gas, such as $PH_3$ may be used.

In the case of $BF_3$, the ion source 110 energizes this feed gas to form ions, such as $BF_2^+$, $BF^{++}$, $F^+$, etc. In some embodiments, portions or components within the ion source 110 may be constructed using tungsten. For example, in one embodiment, the ion source 110 may include an indirectly heated cathode (IHC), housed within a tungsten chamber. This ion source 110 may be contained within a larger housing 100. As the ion source is typically biased at a substantial voltage, it may be necessary to electrically isolate the ion source 110 from the housing 100. This may be achieved through the use of source bushings 115.

Outside the ion source 110 are one or more electrodes 120, which are appropriately biased to attract ions generated in the ion source 110. The electrodes 120 draw these ions to, and then through the electrode 120. In some embodiments, there may be multiple electrodes 120, such as an extraction electrode 121 and a suppression electrode 122. These electrodes 120 may be at different voltages, and therefore must be electrically isolated from one another. These may be achieved through the use of an insulated manipulator assembly 125, which holds the electrodes 120 in place.

The extracted ion beam 130 may then enter a mass analyzer 140, which extracts only ions having the desired charge/mass ratio. The analyzed ion beam 150, which now contains only the ions of interest, is then implanted into the workpiece 190, which may be mounted on a workpiece support 180. In some embodiments, one or more acceleration or deceleration stages 170 may be employed to adjust the speed of the analyzed ion beam 150. These acceleration and deceleration stages 170 may include one or more electrodes used to vary the speed of the analyzed ion beam 150. These electrodes may be held in place by insulated frames, bushings or other supports.

Those of ordinary skill in the art recognize that other components, not shown in FIG. 1, may also be part of the ion implantation system. Those of ordinary skill in the art also recognize that various components in FIG. 1, such as the mass analyzer 140 or acceleration or deceleration stages 170, may be not used in certain ion implantation systems.

Coating caused by exposure to ions within a housing 100 may be harmful to the insulating components disposed within the housing 100. In one embodiment, a coating applied to an insulator, such as a source bushing 115, may create a more conductive surface, thereby counteracting the insulating property of the source bushing 115.

For example, tungsten may become etched from within the ion source 110. The tungsten ions may combine with fluorine ions, generated in the ion source 110 to form a tungsten fluoride gas, such as $WF_6$. This tungsten fluoride gas may then exit the ion source 110 and subsequently deposit tungsten on insulating components, such as source bushings 115, the manipulator assembly 125, or the insulating supports for the acceleration and deceleration stages 170. Tungsten, being a metal, is conductive, and over time, forms a conductive outer layer on these insulating components. Once an adequate amount of tungsten has been deposited on the insulating component, electricity will conduct along this surface. This causes arcing between the ion source 110 and the housing 100, or between the extraction electrode 121 and the suppression electrode 122.

Diamond like carbon (DLC) coatings have excellent wear characteristics and adhesion. Furthermore, DLC coatings are electrically non-conductive. Various commercially available coating made from DLC may be utilized.

Surprisingly, when DLC coating is applied to an insulating component, such as a source bushing 115, the manipulator assembly 125, or the insulating supports for the acceleration and deceleration stages 170, it was found that the rate of tungsten deposition on that component was significantly reduced. For example, during one experiment, varying amounts of DLC coating were applied to bushing materials. Ion implantation, using $BF_3$ as a feed gas, was then performed. It was found that after 100 hours, arcing marks were visible on non-coated bushings, indicating a conductive surface had formed. Tungsten deposition was also seen on some lightly-coated bushings. However, more heavily coated bushings showed no deposition and had no observable electrical conductivity. The thickness of the coating may vary based on the material used for the underlying insulating component. In one embodiment, the coating is sufficiently thick to form a continuous barrier between the underlying component and the exterior environment.

DLC is a carbon coating developed to have a large number of $sp^3$ carbon bonds, which provide the strength and resistance to abrasive wear. While it resists wear, the ability of DLC to retard or inhibit the deposition of metal in an ion implanter is unexpected. The slowing of the deposition process may extend the life of the underlying insulating component. While DLC is explicitly described, other coatings which retard or inhibit the deposition of metal etched from the ion source may also be used.

Without being bound to any particular theory, it is believed that DLC inhibits the bonding of tungsten or tungsten fluoride molecules to the compounds used in the insulating components.

It may be that the deposition of tungsten on insulating components is more prevalent when the feed gas comprises a halogen, such as fluorine or chlorine. As many p-type implants utilize $BF_3$ as the feed gas, this phenomenon may be most common during this type of ion implant. A tungsten fluoride gas is formed in the ion source 110 during the use of this feed gas. The gas exits the ion source 110 and permeates the ion implanter, becoming deposited in regions remote from the ion source 110.

Furthermore, as explained above, the conductive coating may be formed by the etching of metals used in the manufacture of the ion source 110. Thus, while tungsten is described herein, other metals commonly used in components used in ion sources, such as molybdenum, may also comprise the conductive coating. Thus, the use of DLC coating on an insulating component within an ion implanter prevents the formation of a conductive coating formed from a metal found in a component located within the ion source 110.

In addition, although source bushing 115 and manipulator assemblies 125 are described as targets of conductive coating, other insulating components found within the ion implanter may also be coated with DLC to improve their life.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implanter, comprising:
   a housing;
   an ion source in said housing, for generation of ions for implanting into a workpiece, said ion source having a tungsten chamber;
   a feed gas source configured to supply a feed gas comprising fluorine to said ion source, wherein said feed gas is ionized and fluorine ions from said ionized feed gas interact with said tungsten in said ion source and form a tungsten hexafluoride gas, and wherein said tungsten hexafluoride gas exits the ion source and permeates the ion implanter;
   a source bushing, disposed outside of the ion source, to electrically isolate said ion source from said housing;
   an electrode to extract ions from said ion source;
   a first insulating component, disposed outside of the ion source, to hold said electrode in place;
   at least one second insulating component disposed in said housing and outside of the ion source; and
   a workpiece support, disposed outside of the ion source, on which said workpiece to be implanted is disposed, wherein at least one of said first insulating component, said second insulating component and said source bushing is coated with diamond like carbon (DLC), wherein a thickness of said diamond like carbon is sufficient to inhibit deposition of said tungsten hexafluoride gas on said coating.

2. The ion implanter of claim 1, wherein said source bushing is coated with DLC.

3. The ion implanter of claim 1, wherein said first insulating component is coated with DLC.

4. The ion implanter of claim 1, wherein said second insulating component holds an electrode disposed in an acceleration or deceleration stage and said second insulating component is coated with DLC.

5. The ion implanter of claim 1, wherein the feed gas further comprises boron.

6. An ion implanter, comprising:
   an ion source, for generation of ions for implanting into a workpiece, said ion source having a tungsten chamber;
   a feed gas source configured to supply a feed gas comprising fluorine to said ion source, wherein said feed gas is ionized and fluorine ions from said ionized feed gas interact with said tungsten in said ion source and form a tungsten hexafluoride gas, and wherein said tungsten hexafluoride gas exits the ion source and permeates the ion implanter; and
   at least one insulating component, disposed outside of the ion source and to electrically isolate two components having different voltage potentials;
   wherein said insulating component is coated with a coating that resists the deposition of said tungsten hexafluoride gas on said insulating component, wherein said coating comprises diamond like carbon.

7. The ion implanter of claim 6, wherein said feed gas further comprises boron.

8. The ion implanter of claim 6, wherein said insulating component comprises a source bushing.

9. The ion implanter of claim 6, wherein said insulating component holds an electrode.

10. The ion implanter of claim 9, wherein said electrode is disposed in an acceleration or deceleration stage.

11. The ion implanter of claim 9, wherein said electrode extracts ions from said ion source.

12. An ion implanter, comprising:
    a housing;
    an ion source in said housing, for generation of ions for implanting into a workpiece, said ion source having a tungsten chamber;
    a feed gas source configured to supply a feed gas comprising fluorine to said ion source, wherein said feed gas is ionized and fluorine ions from said ionized feed gas interact with said tungsten from said ion source and form a tungsten hexafluoride gas, and wherein said tungsten hexafluoride gas exits the ion source and permeates the ion implanter;
    a source bushing, disposed outside of the ion source, to electrically isolate said ion source from said housing;
    an electrode to extract ions from said ion source; and
    a workpiece support, disposed outside of the ion source, on which said workpiece to be implanted is disposed, wherein said source bushing is coated with diamond like carbon (DLC) to inhibit deposition of said tungsten hexafluoride gas on said source bushing.

13. The ion implanter of claim 12, wherein said electrode is held in place using an insulating component, and said insulating component is coated with DLC.

14. The ion implanter of claim 12, wherein the feed gas further comprises boron.

* * * * *